United States Patent [19]

Dillon et al.

[11] Patent Number: 5,841,522
[45] Date of Patent: Nov. 24, 1998

[54] PHASE DETECTOR

[75] Inventors: Robert F. Dillon, Stoneham; Michael B. Michalik, Waltham, both of Mass.

[73] Assignee: Lumen Laboratories, Inc., Burlington, Mass.

[21] Appl. No.: 901,218

[22] Filed: Jul. 28, 1997

Related U.S. Application Data

[63] Continuation-in-part of Ser. No. 908,219, Aug. 7, 1997.

[60] Provisional application No. 60/022,959 Aug. 1, 1996.

[51] Int. Cl.$^6$ .............................. G01C 3/08; G01S 13/00
[52] U.S. Cl. .......................... 356/5.1; 356/5.15; 342/194
[58] Field of Search ................................... 356/5.1, 5.15; 342/127, 194

[56] References Cited

U.S. PATENT DOCUMENTS 5,150,128  9/1992  Kungelbeck ............................ 342/174
5,517,197  5/1996  Algeo et al. ............................. 342/70
5,745,437  4/1998  Wachter et al. ......................... 367/100

Primary Examiner—Mark Hellner
Attorney, Agent, or Firm—Iandiorio & Teska

[57] ABSTRACT

A phase detector includes a mixer circuit responsive to an input signal and a reference signal to produce an error signal which is a function of the phase difference between the input signal and the reference signal; a phase shifting circuit varies the phase difference between the input and reference signals; a control circuit responsive to the error signal provides a drive signal to the phase shifting circuit to set to quadrature the phase difference between the input and reference signals; and a phase indicator device responsive to the drive signal indicates the phase difference between the component and reference signals.

22 Claims, 5 Drawing Sheets

PHASE DETECTOR

FIELD OF INVENTION

This invention relates to an improved phase detector, and more particularly to such a phase detector usable in a range detector.

PROVISIONAL APPLICATION

This application claims the benefit of U.S. Provisional Application No. 60/022,959 filed Aug. 1, 1996.

RELATED CASE

This application is a continuation-in-part of a U.S. patent application Ser. No. 08/908,219 filed Aug. 7, 1997 entitled "Feedback Controlled Constant Input Radiation Detector for a Phase Detection System", Dillon et al., filed concurrently herewith.

BACKGROUND OF INVENTION

Phase detectors are often used in range detector and communication systems. In range detector systems, for example, the phase difference between a transmitted radiation signal and the return signal reflected from a target can be used to determine the target range. The trend toward higher and higher resolution has driven the demand to the millimeter and submillimeter ranges. A number of different approaches have been tried. Optical triangulation schemes, e.g., photogrammetry, structured light projection systems, can perform in the 0.1 millimeter range but they require skilled labor and substantial time to set up in each application and are quite expensive. Interferometric schemes, e.g., tracking interferometers perform in the 0.1–0.01 millimeter range but are difficult to install and set up and are very expensive. Further, in setting them up, a stylus with a cat's eye or cube reflector or other cooperative target has to be moved along the part or target manually which requires a significant amount of labor time to measure a part. Any interruption of the beam by the operator as he or she moves the stylus causes the system to lose track of the range to the stylus so the system has to restart through a time consuming re-referencing procedure. In addition to these problems, tracking interferometers are slow acting and delicate even though they do obtain sufficient accuracy.

Laser radar schemes are much faster, do not require manual operators, are non-contact and require no special cooperative target, but they are extremely expensive and have not been able to achieve the greater accuracy, in the range of 1 millimeter, desired. There are a number of other problems with laser radar devices. The high frequency components, e.g., mixers and multipliers, are subject to gain drift and are sensitive to input amplitude fluctuations which cause errors in phase measurement that result in errors in range measurement. These systems also suffer inaccuracies in phase measurement due to d.c. offset in electronic components and noise from spurious r.f. signals in or near the carrier band.

SUMMARY OF INVENTION

It is therefore an object of this invention to provide an improved phase detector.

It is a further object of this invention to provide such an improved phase detector which is insensitive to component d.c. drift.

It is a further object of this invention to provide such an improved phase detector which is insensitive to input amplitude fluctuation.

It is a further object of this invention to provide such an improved phase detector which is insensitive to component gain drift.

It is a further object of this invention to provide such an improved phase detector which is insensitive to spurious r.f. signals and other interference even in or near the carrier band.

It is a further object of this invention to provide such an improved phase detector which can resolve extremely small phase differences.

It is a further object of this invention to provide such an improved phase detector which can resolve extremely small phase differences representing time differences of less than 200 femtoseconds.

It is a further object of this invention to provide such an improved phase detector which can measure time delays of under 200 femtoseconds with low cost components at low frequencies in the range of 60 MHz.

The invention results from the realization that a truly effective low cost, low frequency, high resolution, low noise phase detector suitable for use in a range detector can be achieved by setting at quadrature the phase difference between a reference carrier signal and an input modulated carrier signal so that the carrier mixer d.c. output is nulled and determining the phase shift from the drive signal that sets the phase difference to quadrature and the further realization that by chopping the radiation at a lower frequency and detecting the null of the chopped frequency at the chopped mixer output, the effects of d.c. offset and spurious r.f. signals are avoided.

This invention features a quadrature phase detector including a mixer circuit responsive to an input signal and a reference to produce an error signal which is a function of the phase difference between the input signal and reference signal. There is a phase shifting circuit for varying the phase difference between the input and reference signals. A control circuit, responsive to the error signal, provides a drive signal to the phase shifting circuit to set the quadrature, the phase difference between the input and reference signals. A phase indicator device responsive to the drive signal indicates the phase difference between the input and reference signals.

In a preferred embodiment the phase shifting circuit may include a variable delay line. The phase shifting circuit may shift the phase of the reference signal with respect to the input signal. The control circuit may include an integrating feedback circuit. The mixer circuit may include an analog multiplier. The control circuit may include a low-pass filter for detecting a d.c. level which approaches zero at quadrature. There may be a range indicator circuit responsive to the phase indicator device for converting the phase difference to a range.

The invention also features a chopped phase detector including a carrier mixer circuit responsive to a chopped carrier input signal and a carrier reference signal to produce a carrier mixer output signal which is a function of the carrier input and carrier reference signals. A filter circuit extracts the chopped frequency component of the carrier mixer output signal. A chopper mixer circuit responsive to the extracted chopped frequency component and a chopper reference signal provides a phase measurement signal which is a function of the phase difference between the carrier reference signal and the chopped carrier input signal.

In a preferred embodiment the filter circuit may include a bandpass filter for passing the chopped frequency component whose amplitude is a function of the phase difference, and rejecting the d.c. component generated by d.c. offset and rejecting spurious r.f. The carrier mixer may include an analog multiplexer. The filter circuit may include a bandpass filter. The chopper mixer circuit may include an analog multiplier. The carrier signal may be at approximately 60 MHz. The chopped frequency component may be a lower frequency than the carrier signal. The chopped frequency component may be at approximately 700 Hz. The chopper mixer circuit may include a low pass filter. There may be a phase indicator device responsive to the phase measurement signal to indicate the phase difference and a range indicator device responsive to the phase indicator device for converting the phase difference to a range.

The invention also features a chopped, quadrature phase detector system which is usable in a range detector including a source of radiation for transmission to a target, a carrier modulation circuit for modulating the radiation at the first frequency and a chopper device for periodically interrupting the transmitted radiation at a second frequency. The radiation detector detects the carrier input signal returned from the target. There is a phase detector including a carrier mixer circuit responsive to the carrier input signal and a carrier reference signal to produce an error signal which is a function of the phase difference between the carrier input signal and the carrier reference signal. A phase shifting circuit varies the phase between the carrier input and carrier reference signal. A chopper mixer circuit responsive to the error signal and the chopper reference signal provides a phase measurement signal which is a function of the phase difference between the carrier reference signal and the chopped carrier input signal for driving the phase shifting circuit to set to quadrature the phase difference between the carrier input and the carrier reference signals. A phase indicator device responsive to the phase measurement signal indicates the phase difference between the carrier input and carrier reference signals.

In a preferred embodiment there is a range indicator device responsive to the phase indicator device for indicating the range to the target. The carrier mixing circuit may include a filter circuit having a bandpass filter for passing the chopped frequency component whose amplitude is a function of the phase difference in the carrier input and carrier reference signals and rejecting the d.c. component generated by d.c. offset and spurious r.f. The chopper mixer circuit may include a low pass filter for detecting a d.c. level which approaches zero at quadrature.

DISCLOSURE OF PREFERRED EMBODIMENT

Other objects, features and advantages will occur to those skilled in the art from the following description of a preferred embodiment and the accompanying drawings, in which.

This invention may be accomplished by using a typical laser radar source suitable for range detection and modulating it at a carrier frequency, and then transmitting it through a chopper device to a target. The carrier modulation of the radiation beam may be 60 MHz, for example, and the chopping or interrupting of the radiation beam may be at 700 Hz. The return beam is detected and then mixed with a carrier reference circuit of 60 MHz and a chopper frequency reference of 700 Hz to obtain any difference in phase between the output beam to the target and the returning carrier input signal. That phase can then be converted to range.

Two innovations are used to reduce the noise and achieve extremely high accuracies in the femptosecond range of time-equivalent phase differences using conventional electronic components and reasonably low, e.g., 60 MHz, frequency ranges. First, the carrier input signal of the return beam is mixed or multiplied with a carrier reference signal and the carrier reference signal is driven to quadrature with the returning carrier signal input. By driving it to quadrature, the d.c. output of the mixer is driven to zero. Thus, instead of the necessity for detecting the small signal out of the mixer which represents the phase, all that is necessary is that the d.c. output of the mixer be detected as at zero. This indicates that quadrature has been achieved between the reference signal and the input signal. The drive signal required to drive the reference into quadrature with the return signal then represents the actual phase difference which represents the range. Since the d.c. output of the mixer being sought is a nullity or zero because the reference signal has been driven into quadrature, many noise sources that may be on the signals are eliminated from the phase measurement. Thus sensitivity to input amplitude fluctuations and mixer gain drifts no longer have an effect. Second, the radiation being transmitted to the target is chopped at 700 Hz. Upon detection of the carrier input signal with the return beam, the 60 MHz carrier envelope is detected, but at 700 Hz instead of the normal d.c. level. Thus the system seeks the nullity at 700 Hz rather than at d.c. This effects a second noise reduction because now there is no response to d.c. offsets since the signal being processed is a 700 Hz signal, and there is no response to mixer outputs generated by other spurious r.f. signals, for example, at or near the carrier band of 60 MHz. Those noise sources too are eliminated because the 60 MHz carrier is being monitored at 700 Hz. These innovations are enhanced by the presence of a non-fluctuating input signal which is produced by the Feedback Controlled Constant Input Radiation Detector for a Phase Detection System by the same inventors, of which this is a continuation-in-part.

Figure 1:
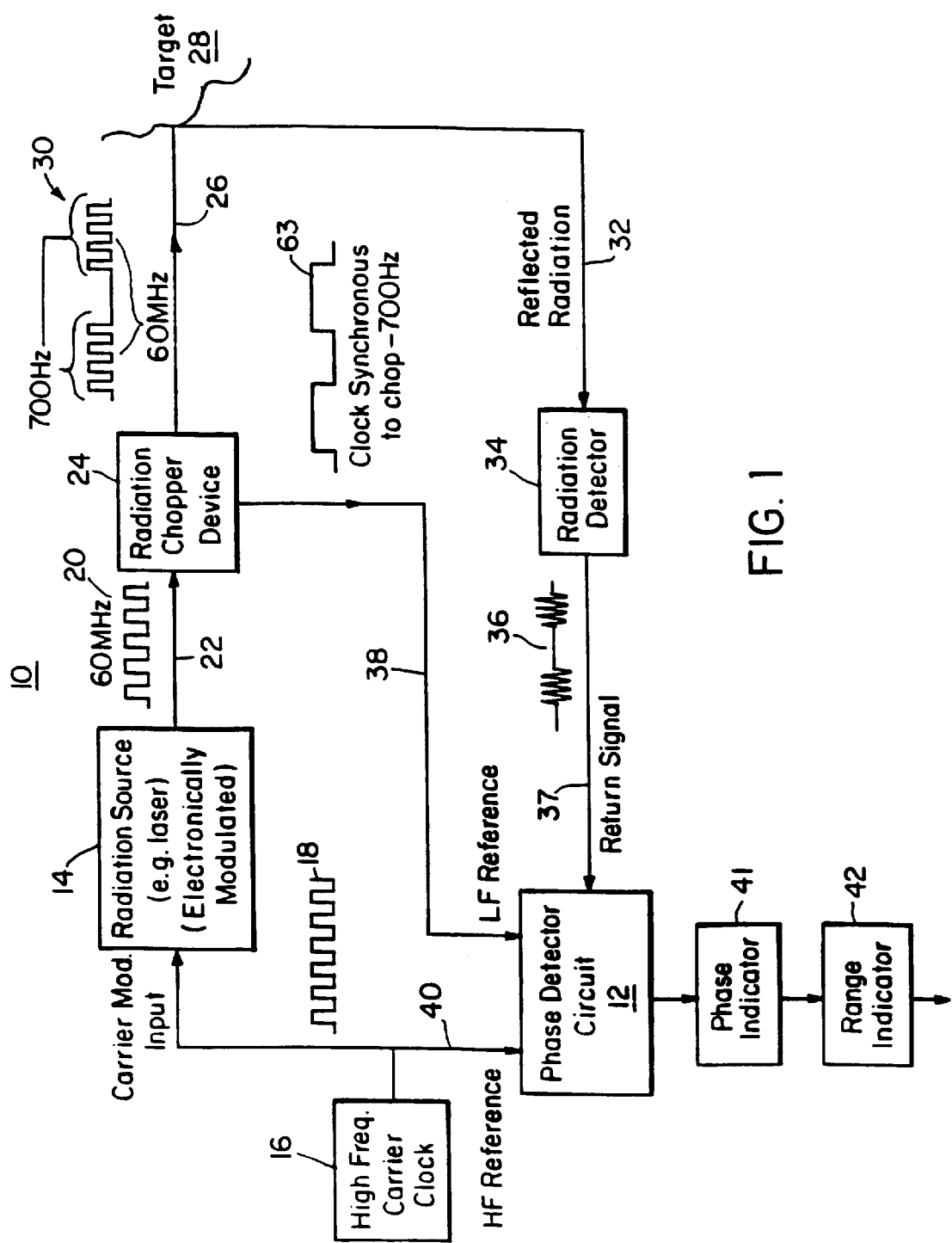
FIG. 1 is a schematic block diagram of a range detector system which utilizes a quadrature phase detector and chopped phase detector according to this invention.

There is shown in FIG. 1 a range detection system 10 which uses a phase detector circuit 12 according to this invention. A radiation source 14 such as a semiconductor laser diode producing an output beam of approximately 650 nm wavelength is modulated by a high frequency carrier clock 16 to produce a 60 MHz signal 18 to produce a carrier 10 at output 22 to radiation chopper device 24. Chopper device chops the radiation at a very low frequency, for example, 700 Hz, to provide a 60 MHz carrier chopped at 700 Hz as the radiation beam 26 transmitted to target 28, as indicated by waveform 30. The return beam of radiation 32 sensed by radiation detector 34 produces a carrier input signal 36 which is delivered on line 37 as the return signal to phase detector circuit 12. There it is combined with the low frequency reference signal on line 38, which is the 700 Hz chopper frequency 63; and it is also combined with the high frequency reference signal on line 40 which represents the carrier frequency of 60 MHz. Phase detector circuit 12 delivers to phase indicator 41 an output representative of the phase difference between the outgoing beam 26 and the return beam 32. This phase difference can then be converted by range indicator 42 into the range, R, to the target in a well-known fashion, for example, using the expression $$R = \frac{\delta c}{2} + n\left(\frac{c}{4f}\right) \quad (1)$$

where δ is the reference delay, c is the speed of light, f is the modulation frequency, and n is an integer ambiguity variable created by the 2π phase ambiguity of the integral.

Figure 2:
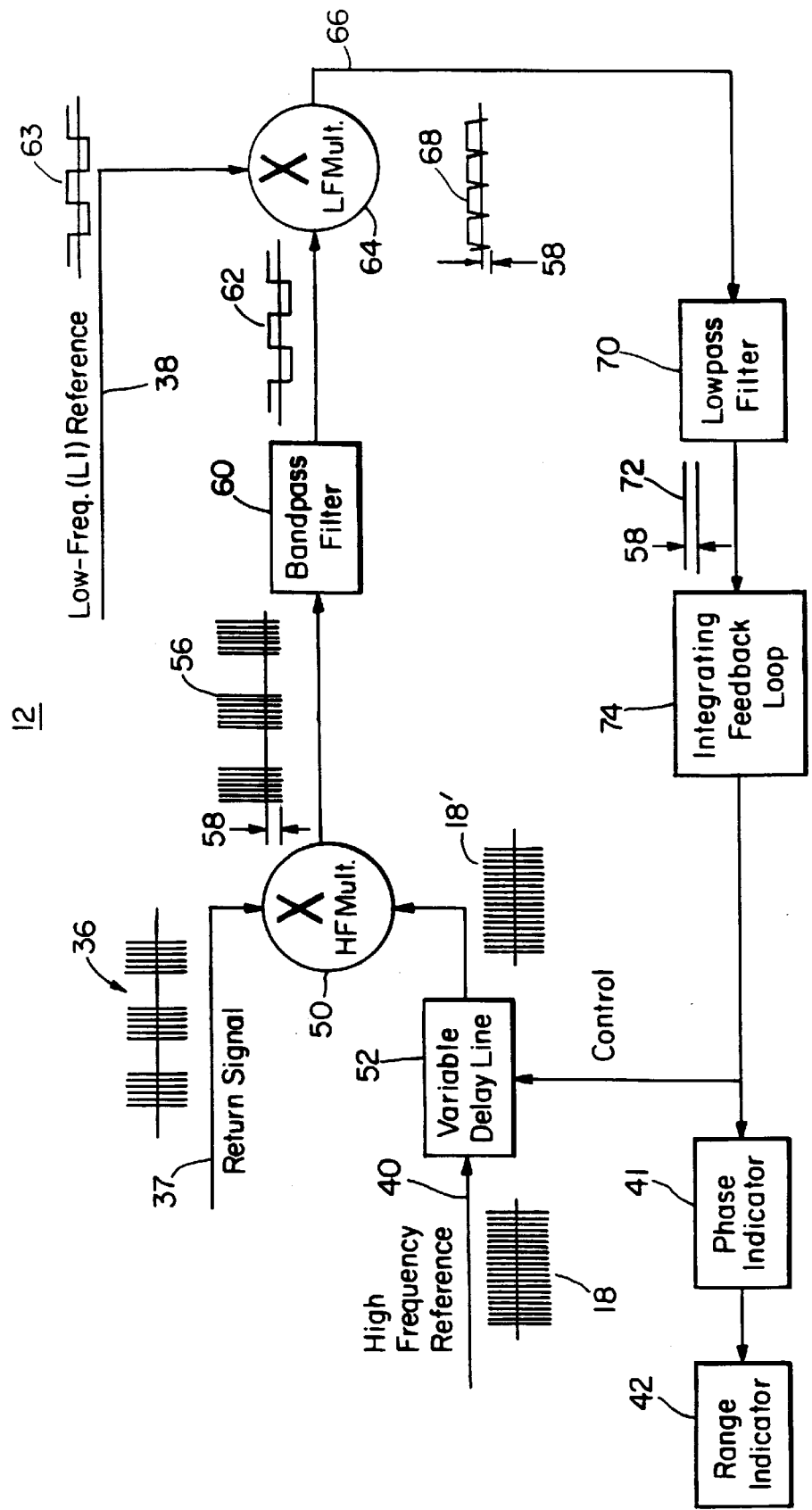
FIG. 2 is a schematic more detailed block diagram of the phase detector circuit of FIG. 1 prior to return signal delay measurement.

The operation may be better understood with respect to FIG. 2, where phase detector circuit 12 has been shown in greater detail. Return signal 36 on line 37 is submitted to mixer or multiplier 50, where it is combined with signal 18' from variable delay line 52 derived from the high frequency 60 MHz reference signal 18 on line 40. The output 18' of variable delay line 52 in this depiction in FIG. 2 before any adjustment has been made is exactly the same signal 18 as was submitted to variable delay line 52. When beat together in mixer or multiplier 50 with carrier input signal 36, which is also at 60 MHz but chopped at 700 Hz and shifted somewhat because of its delayed course to the target and back, this, results in a 120 MHz signal 56 chopped at 700 Hz and with a d.c. offset 58. Signal 56 is put through bandpass filter 60 which removes the high frequency portion and leaves only the 700 Hz envelope as indicated by the waveform of signal 62. This is beat with the low frequency 700 Hz reference signal on line 38 in mixer or multiplier 64. The output of this on line 66, signal 68, is double the frequency, or 1400 Hz, and still possesses the same d.c. offset 58. This signal is put through low pass filter 70 which blocks the 1400 Hz signal, producing only a d.c. level 72 which represents the d.c. offset 58 or indication of phase difference between the reference 18 and the carrier input signal 36 submitted to multiplier 50. A conventional integrating feedback loop 74, typically employed for stability, provides a signal representative of that d.c. offset or phase difference to variable delay line 52. That signal drives variable delay line 52 to shift its output 18' so that it is not in phase with carrier input signal 36 but is in quadrature. That is, assuming carrier input signal 36 is a sine wave, adjusted reference signal 18' would be a cosine wave adjusted 90° out of phase with it. Phase detector circuit 12 then operates as shown in FIG. 3.

Figure 3:
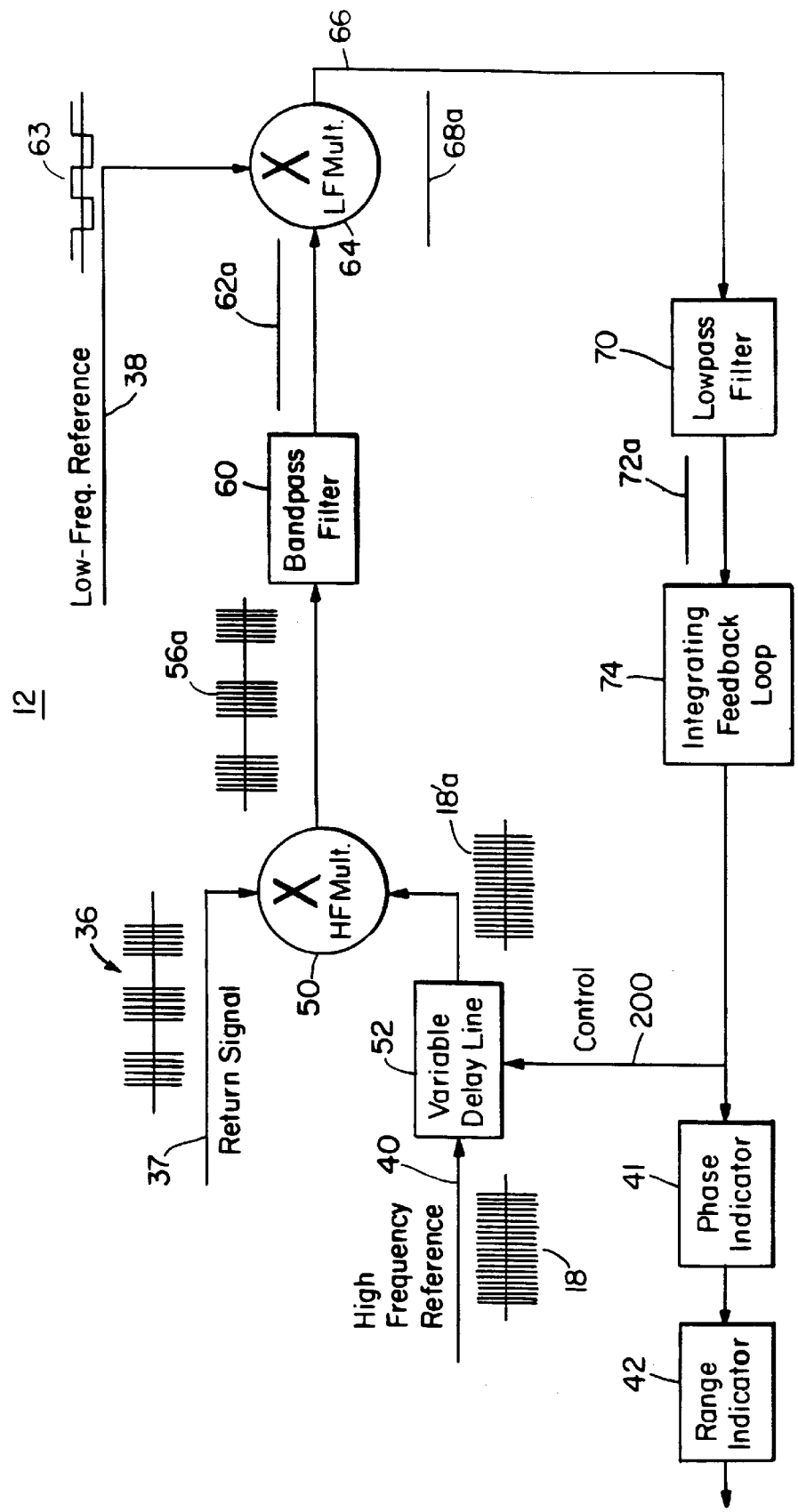
FIG. 3 is a view similar to FIG. 2 after return signal delay measurement.

When this adjustment is made through variable delay line 52, FIG. 3, its output now shifts its phase so that when the signal 18'*a* is mixed with the returning carrier input signal 36 in multiplier 50, the output waveform 56*a* no longer has a d.c. offset. After submission to bandpass filter 60 the output now, instead of having a 700 Hz variation, is simply at zero as indicated by 62*a*. When this is mixed with the low frequency signal on line 38 in the form of 700 Hz reference signal 63 in multiplier 64, the output is no longer a 1400 Hz varying offset voltage; rather, it is zero as indicated at 68*a*. Thus the output of low pass filter 70 is also zero 72*a*, and the signal to be fed back through integrating feedback loop 74 to variable delay line 52 is stabilized. The signal, 200, that was required from integrating feedback loop 74 to variable delay line 52 to shift the high frequency reference 18'*a* into quadrature with the carrier input signal 36 on line 37 represents, i.e., is proportional to, the phase difference between the reference and the carrier input signal. This phase difference is indicated by phase indicator circuit 41 and in a range detection system can then be further submitted to range indicator 42 to calculate the range as previously explained.

Figure 4:
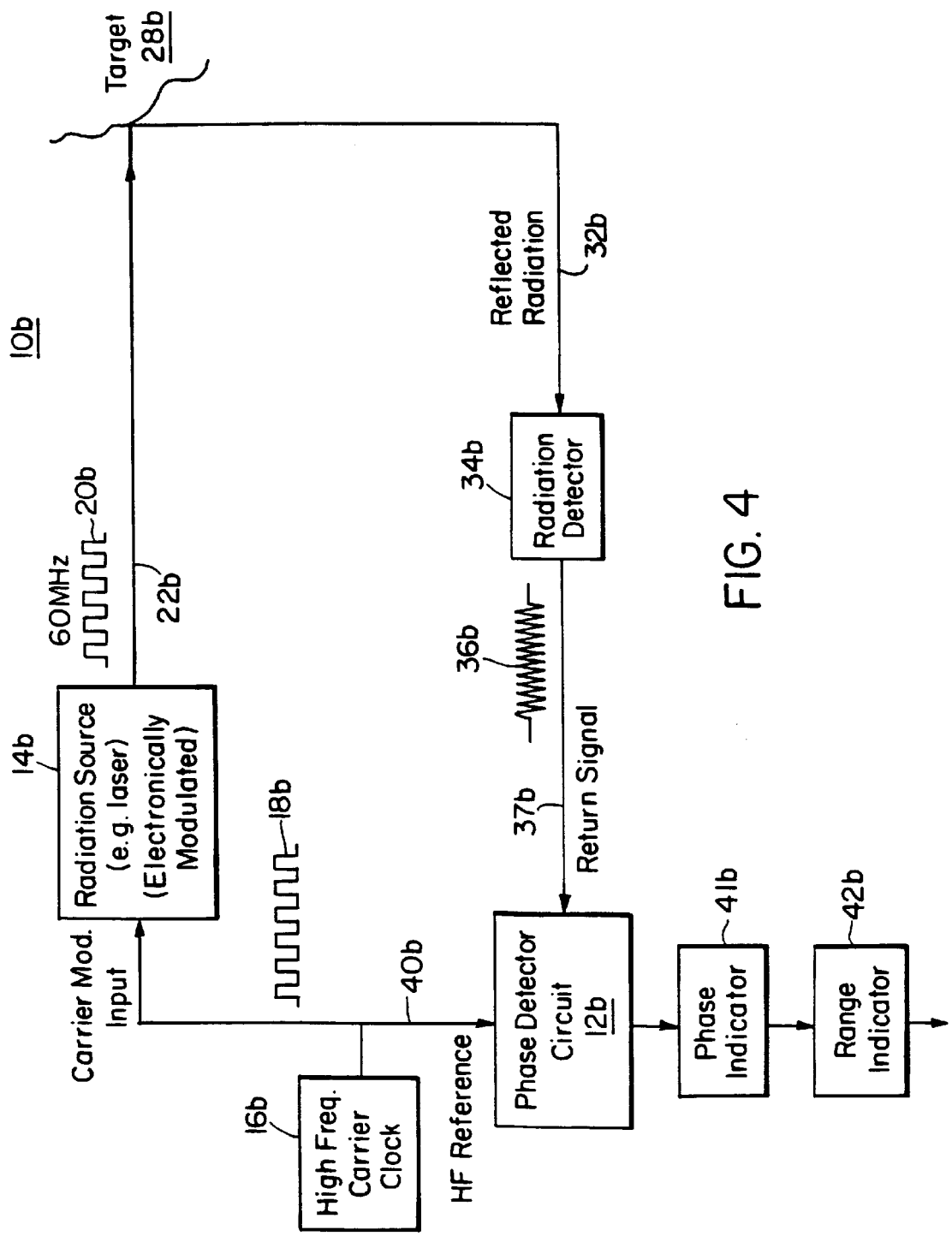
FIG. 4 is a view similar to FIG. 1 showing the quadrature phase detector without the chopped phase detector.
Figure 5:
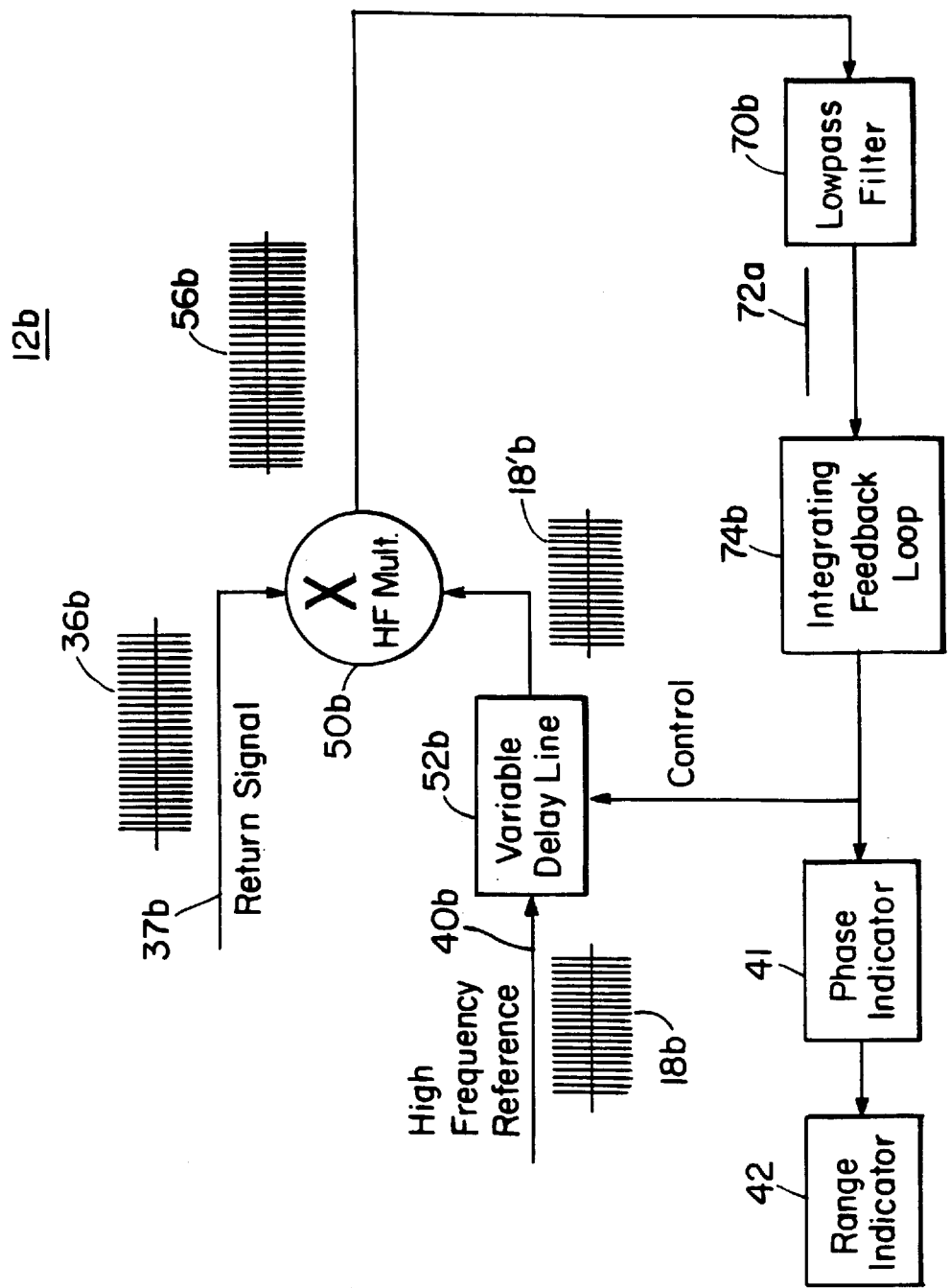
FIG. 5 is a more detailed schematic diagram of the system of FIG. 4.

Although thus far the invention is shown as uses both quadrature and chopping, this is not a necessary limitation of the invention. Either of these two approaches may be used separately to provide a significant reduction in noise and consequent gain in resolution. For example, as shown by range detection system 10*b*, FIG. 4, radiation source 14*b*, signal 20*b*, its output 22*b*, sent directly to target 28*b* without first going through any chopper device. The reflected radiation then, as it returns to radiation detector 34*b*, is presented strictly as the carrier signal 36*b* with no interruption or chopping feature. Thus phase detector circuit 12*b* receives no low frequency reference input and simply drives the 60 MHz carrier signal to quadrature with the returning carrier input signal and detects the zero d.c. mixer output level as before, as shown in FIG. 5, where now the return signal 36*b* on line 37*b*, FIG. 5, is not chopped at 700 Hz and the output 56*b* from multiplier 50*b* is the double frequency 120 MHz signal unchopped, which is delivered directly to low pass filter 70*b*. Referring to FIG. 3, in a similar fashion, the chopper device can be retained and the quadrature feature could be omitted with the result that some but not all of the noise and interference would be eliminated.

Although specific features of this invention are shown in some drawings and not others, this is for convenience only as each feature may be combined with any or all of the other features in accordance with the invention.

Other embodiments will occur to those skilled in the art and are within the following claims:

What is claimed is:

1. A quadrature phase detector comprising:

a mixer circuit responsive to an input signal and a reference signal to produce an error signal which is a function of the phase difference between said input signal and reference signal;

a phase shifting circuit for varying the phase difference between said input and reference signal;

a control circuit responsive to said error signal, for providing a drive signal to said phase shifting circuit to set to quadrature the phase difference between said input and reference signals; and a phase indicator device responsive to said drive signal to indicate the phase difference between said input and reference signals.

2. The quadrature phase detector of claim 1 in which said phase shifter circuit includes a variable delay line.

3. The quadrature phase detector of claim 1 in which said phase shifter circuit shifts the phase of the reference signal.

4. The quadrature phase detector of claim 1 in which said control circuit includes an integrating feedback circuit.

5. The quadrature phase detector of claim 1 in which said mixer circuit includes an analog multiplier.

6. The quadrature phase detector of claim 1 in which said control circuit includes a low pass filter for detecting a d.c. level which approaches zero at quadrature.

7. The quadrature phase detector of claim 1 further including a range indicator device responsive to said phase indicator device for converting said phase difference to a range.

8. A chopped phase detector comprising:

a carrier mixer circuit responsive to a chopped carrier input signal and a carrier reference signal to produce a carrier mixer output signal which is a function of the phase difference of the carrier input and carrier reference signals;

a filter circuit for extracting the chop frequency component of the carrier mixer output signal; and a chopper mixer circuit, responsive to said extracted chop frequency component and a chopped reference signal, to provide a phase measurement signal which is a function of the phase difference between the carrier reference signal and the chopped carrier input signal.

9. The chopped phase detector of claim 8 in which said filter circuit includes a band pass filter for passing the chop frequency component whose amplitude is a function of the phase difference and rejecting the d.c. component generated by d.c. offset and spurious r.f.

10. The chopped phase detector of claim 8 in which said carrier mixer includes an analog multiplier.

11. The chopped phase detector of claim 8 in which said filter circuit includes a bandpass filter.

12. The chopped phase detector of claim 8 in which said chopper mixer circuit includes an analog multiplier.

13. The chopped phase detector of claim 8 in which said carrier signal is at approximately 60 MHz.

14. The chopped phase detector of claim 8 in which said chop frequency component is a lower frequency than the carrier signal.

15. The chopped phase detector of claim 8 in which said chop frequency component is approximately 700 Hz.

16. The chopped phase detector of claim 8 in which said chopper mixer circuit includes a low pass filter.

17. The chopped phase detector of claim 8 further including a phase indicator device responsive to the phase measurement signal to indicate the phase difference.

18. The chopped phase detector of claim 17 further including a range indicator device responsive to said phase indicator device for converting said phase difference to a range.

19. A chopped, quadrature, phase detector system comprising:

a source of radiation for transmission to a target;

a carrier modulation circuit for modulating said radiation at a first frequency;

a chopper device for periodically interrupting the transmitted radiation at a second frequency;

a radiation detector for detecting the carrier input signal return from the target;

a phase detector including a carrier mixer circuit responsive to the carrier input signal and a carrier reference signal to produce an error signal which is a function of the phase difference between said carrier input signal and carrier reference signal;

a phase shifter circuit for varying the phase between said carrier and carrier reference signals;

a chopper mixer circuit responsive to said error signal and a chopper reference signal to provide a phase measurement signal, which is a function of the phase difference between the carrier reference signal and the chopped carrier input signal, for driving said phase shifting circuit to set to quadrature the phase difference between said carrier input and carrier reference signals; and a phase indicator device responsive to said phase measurement signal to indicate the phase difference between said carrier input and carrier reference signals.

20. The chopped quadrature phase detector system of claim 19 further including a range indicator device responsive to said phase indicator device for indicating the range to the target.

21. The chopped quadrature phase detector system of claim 19 in which said carrier mixer circuit includes a filter circuit having a bandpass filter for passing the chop frequency component whose amplitude is a function of the phase difference in the carrier input and carrier reference signals and rejecting the d.c. component generated by d.c. offset and spurious r.f.

22. The chopped quadrature phase detector system of claim 19 in which said chopper mixer circuit includes a low pass filter for detecting a d.c. level which approaches zero at quadrature.

* * * * *